United States Patent

Shirai et al.

[11] Patent Number: 5,784,781
[45] Date of Patent: Jul. 28, 1998

[54] MANUFACTURING PROCESS FOR ORGANIC CHIP CARRIER

[75] Inventors: Masaharu Shirai, Kusatsu; Kenji Terada, Moiriyama; Yutaka Tsukada, Shiga-ken; Shuhei Tsuchita, Kusatsu, all of Japan

[73] Assignee: International Business Machines Corporation, Armonk, N.Y.

[21] Appl. No.: 559,214

[22] Filed: Nov. 16, 1995

[30] Foreign Application Priority Data

Nov. 22, 1994 [JP] Japan .................. 6-288114

[51] Int. Cl.$^6$ ............................................ H05K 1/14
[52] U.S. Cl. ................................ 29/846; 29/852; 427/97
[58] Field of Search .............................. 29/852, 830, 846; 427/97

[56] References Cited

U.S. PATENT DOCUMENTS

| | | |
|---|---|---|
| 5,092,032 | 3/1992 | Murakami . |
| 5,224,264 | 7/1993 | Takahashi et al. . |
| 5,284,725 | 2/1994 | Takatsu . |
| 5,308,929 | 5/1994 | Tani et al. . |
| 5,562,970 | 10/1996 | Satoh . |

FOREIGN PATENT DOCUMENTS 6314869  11/1994  Japan ........................... 29/852

*Primary Examiner*—Carl J. Arbes
*Attorney, Agent, or Firm*—Calfee, Halter & Griswold LLP

[57] ABSTRACT

A manufacturing process for an organic chip carrier is disclosed which permits one to form a substantially bowl-shaped via hole in the substrate of the chip carrier, which makes it easy to deposit a conductive layer having a substantially uniform thickness on the sidewall of the via hole. In accordance with the manufacturing process, photosensitive resin 3 is provided on a substrate 1 in a thickness which is the thickness necessary for a final insulating layer plus a thickness to be removed by, for example grinding, the photosensitive resin 3. Cavities are then formed in the photosensitive resin 3 in a predetermined pattern by exposure and development. The photosensitive resin 3 formed with the cavities 8 is heat-cured. Subsequently, when the photo-cured layer 6a and a part of the heat-cured layer 3a are removed, e.g., ground off, a substantially bowl-shaped via hole 9 is formed.

9 Claims, 2 Drawing Sheets

MANUFACTURING PROCESS FOR ORGANIC CHIP CARRIER

BACKGROUND OF THE INVENTION

1. Field of the Invention

The present invention relates to a process for manufacturing an organic chip carrier, such as a printed circuit board, and, more particularly, to a process for forming a substantially bowl-shaped via hole in an insulating layer of the organic chip carrier.

2. Description of the Related Art

In forming a via hole for signal connection in an insulating layer of an organic chip carrier, such as a printed circuit board, special processes have been employed to make the opening of the via hole wider than the bottom of the via hole and to relax the slope on the bottom so that a conductive layer is readily deposited onto the sidewall of the via hole with a uniform thickness.

Conventional known special processes include (1) patterning photosensitive resin with photoresist, and softening the photosensitive resin with heat to slacken the lower portion of the via hole, thereby widening the opening of the lower portion upwardly and relaxing the slope on the bottom of the lower portion, and (2) applying and patterning resist on an insulating layer, forming a gentle slope on the bottom of the resist by applying another resist with lower viscosity, and forming a lower portion along the slope on the bottom of the resist in the insulating layer by conducting dry etching.

However, there have been problems such that, in the process (1), it is difficult to form the lower portion of the via hole in a desired shape due to heating temperature or heating duration because the photosensitive resin is softened with heat, while in the process (2), processing with another resist is required in addition to normal processing with the resist, which leads to a complicated process.

SUMMARY OF THE INVENTION

The object of the present invention is to provide a relatively simple process for forming a via hole in an insulating layer of an organic chip carrier, which permits one to easily and uniformly deposit an electrically conductive layer onto the sidewall of the via hole.

To attain the above object, the process for manufacturing an organic chip carrier according to the present invention comprises the steps of: (1) forming a resin layer on a substrate, the resin layer including photosensitive resin, the photosensitive resin being positioned on the top surface, and the resin layer having a thickness greater than a first thickness; (2) forming cavities in a predetermined pattern by exposing and developing the resin layer; (3) heat-curing the resin layer formed with cavities; and (4) removing, e.g., grinding off, a part of the heat-cured resin layer to the first thickness, thereby forming via holes derived from the cavities.

Also, in the manufacturing process for an organic chip carrier according to the present invention, it is desirable that the developing is carried out, in part, in a direction substantially normal to the thickness of the resin layer, the via hole having a larger area at its opening than the area of the bottom.

In forming the resin layer on the substrate, the resin constituting the resin layer may be photosensitive resin only, or a resin layer in which photosensitive resin is coated over non-photosensitive resin in a thin thickness. A first thickness of this resin layer is, for example, the thickness of the final insulating layer. In forming the resin layer on the substrate, the resin layer is formed with a thickness greater than the first thickness.

In the step of forming cavities in a predetermined pattern in the photosensitive resin by exposing and developing, development proceeds not only in the direction of thickness of the resin layer but also in the direction normal to the thickness of the resin layer. The cavity formed by the development has a substantially circular section with a diameter slightly larger than the thickness of the resin layer.

Thereafter, when the resin layer is heat cured, the machining process can be performed. Then, when the photo-cured layer and a part of the heat-cured layer are removed, e.g., ground off, substantially the upper half of the substantially circular cavity is removed so that a substantially bowl-shaped via hole derived from the cavity is formed.

DESCRIPTION OF THE PREFERRED EMBODIMENT

A preferred embodiment of the present invention will be explained in the following with reference to the drawings. FIGS. 1–6 depict all essential steps of the preferred embodiment of the present invention for manufacturing an organic chip carrier.

Figure 1:
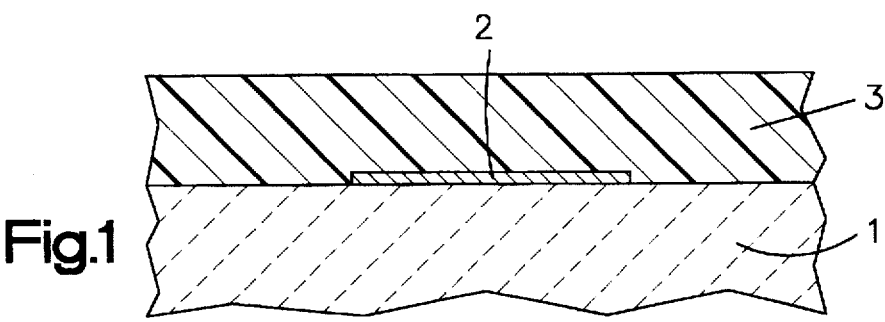
FIG. 1 is a sectional view illustrating the step of forming a photosensitive resin layer in the manufacturing process for the organic chip carrier of the present invention.

Referring to FIG. 1, copper is plated on a substrate 1 consisting of an insulating material and patterned to form a copper terminal 2 at a predetermined location. The copper terminal 2 serves as a terminal for wiring for connecting a conductor layer in which a via hole is later formed.

Figure 2:
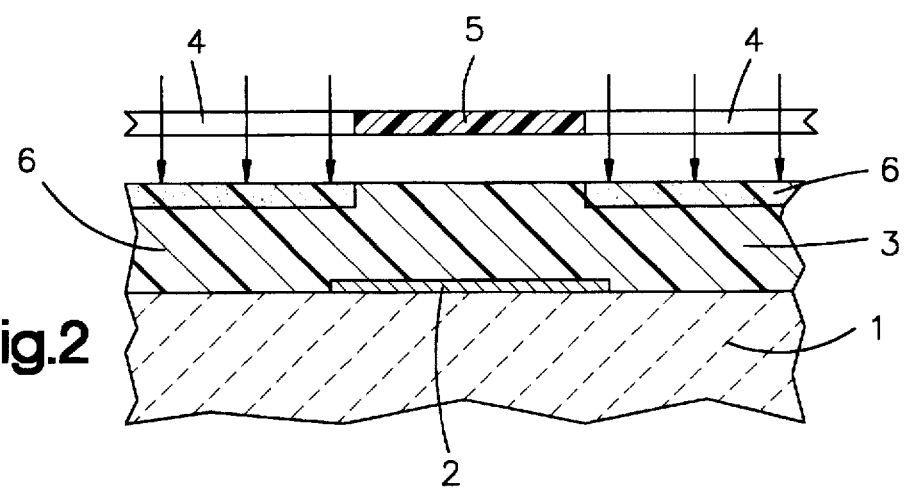
FIG. 2 is a sectional view illustrating the exposure step in the manufacturing process for the organic chip carrier of the present invention.

Referring to FIG. 2, photosensitive resin 3 is applied on the surface of substrate 1 on which the copper terminal 2 is formed. The thickness of the photosensitive resin 3 is a thickness ultimately necessary for the insulation layer plus a thickness for subsequent removal, e.g., grinding, of the photosensitive resin, and therefore thicker than the necessary thickness for the photosensitive resin as a normal insulating layer. The photosensitive resin 3 which can be used includes photosensitive epoxy resin, sold under the tradename Probimer 52, commercially available from Ciba-Geigy Ltd. Then, the primary heat treatment is conducted on the photosensitive resin 3. The primary heat treatment is treatment for preventing adhesion between the photosensitive resin 3 and a mask 5 for patterning.

Then, as shown in FIG. 2, the mask 5 for forming the via hole is placed so that the mask 5 is positioned at a location corresponding to the copper terminal 2, and then the photosensitive resin 3 is exposed through the mask. This causes the area other than the location of the mask 5 where the via hole is formed (hole 4) to be exposed and photo-cured. A photo-cured layer 6 formed by this photo-curing is formed on the surface of the photosensitive resin 3.

Figure 3:
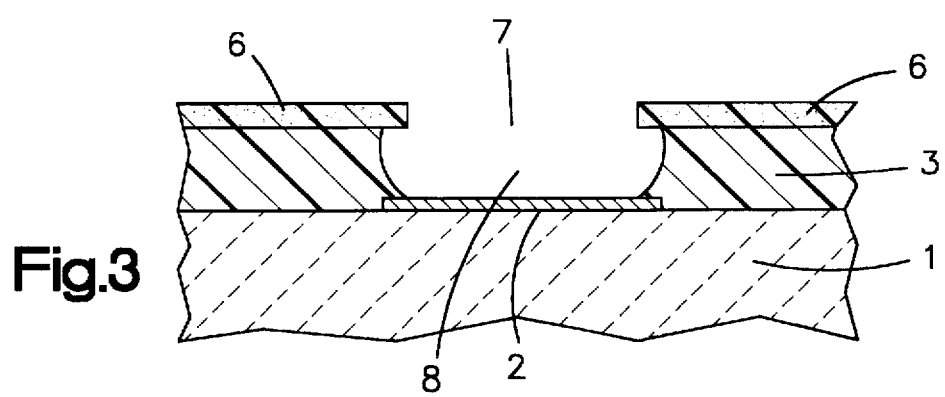
FIG. 3 is a sectional view illustrating the development step in the manufacturing process for the organic chip carrier of the present invention.

Referring to FIG. 3, developing agent develops an area not photo-cured on the surface of the photosensitive resin 3. A hole 7, the diameter of which substantially corresponds to the diameter of mask 5, is opened in the non-photo-cured area. The developing agent penetrates into the photosensitive resin 3 through the hole 7 to etch the photosensitive resin 3, and to form a cavity 8. In this case, the diameter of hole 7 is designed in such size as causing the cavity 8 to reach the copper terminal 2 positioned under the photosensitive resin 3.

In forming the cavity 8 with etching by the developing agent, etching is also carried out in the direction substantially normal to the depth of the cavity 8 formed in the photosensitive resin 3 (side-etching) to form a substantially arcuate side periphery as shown in FIG. 3. That is, the section of cavity 8 in this case is substantially circular with a diameter slightly greater than the thickness of the photosensitive resin. The bottom of the cavity 8 near the copper terminal 2 has a gentle slope.

Figure 4:
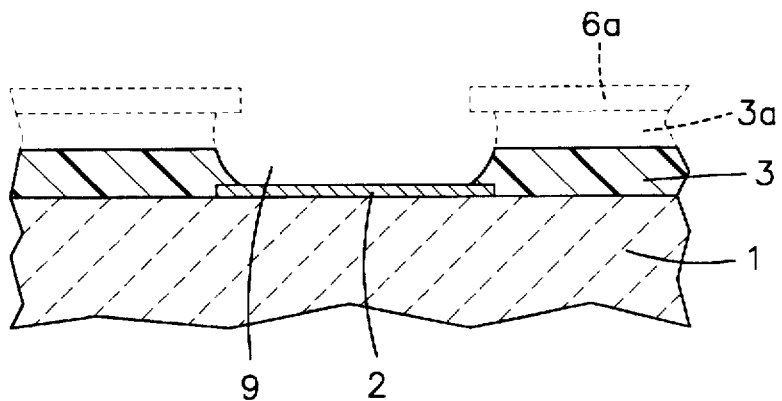
FIG. 4 is a sectional view illustrating the removal, e.g., grinding, step in the manufacturing process for the organic chip carrier of the present invention.

Next, referring to FIG. 4, after the photosensitive resin 3 is completely cured, the photo-cured layer 6a and a part of the heat-cured layer 3a are removed, e.g., ground off, as shown by the broken line. This step removes about one half of the upper portion of the cavity 8 formed in the completely cured photosensitive resin 3 as shown in FIG. 4 so that a via hole 9 formed by a part of cavity 8 is formed. The via hole 9 is substantially bowl-shaped and has an area of its opening larger than the bottom area, is gradually reduced for the opening area in the direction of depth, and has a bottom with a gentle slope.

Figure 5:
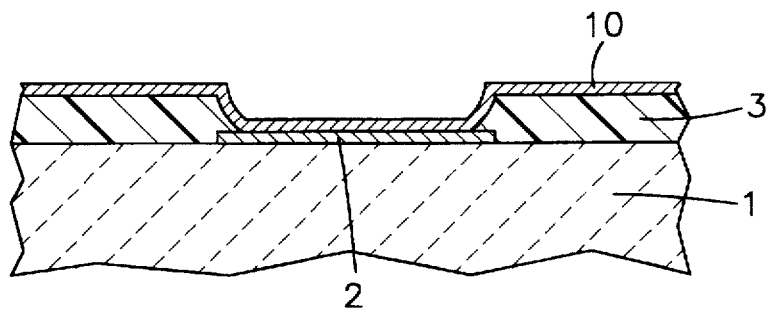
FIG. 5 is a sectional view illustrating the step of forming a conductive layer on a surface containing a via hole in the manufacturing process for the organic chip carrier of the present invention.
Figure 6:
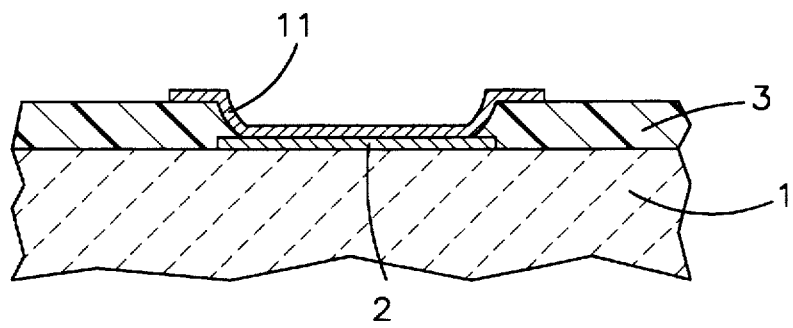
FIG. 6 is a sectional view illustrating the step of patterning the conductive layer of FIG. 5 in the manufacturing process for the organic chip carrier of the present invention.

In this state where the via hole 9 is formed, as depicted in FIG. 5, copper is plated on the surface to connect the conductive layers on the copper terminal 2 and of the surface copper plating 10 through a copper plating layer on the sidewall of the via hole 9. In this step, the copper plating layer is smoothly formed on the sidewall of the via hole in a uniform thickness. Thereafter, as depicted on FIG. 6, the copper plating 10 on the upper surface of the photosensitive resin 3 is patterned to form the desired electrical connection to the copper terminal 2.

In the present invention, the thickness of the photosensitive resin 3 in FIG. 1 is determined to be the thickness ultimately necessary for the insulating layer plus the thickness to be removed. Accordingly, in FIG. 4, the cured photosensitive resin 3 after, for example, grinding, has a thickness required for the insulating layer.

As depicted in FIG. 4, the photo-cured layer and a part of the heat-cured layers are removed, e.g., ground off. However, in the case of resin such as the photosensitive epoxy (Probimer 52) only the surface layer of which is photo-cured, the thickness of the insulating layer to be removed is, for example, 5 μm or more, preferably 10 μm or more, from the surface of the insulating layer or the top surface of the photo-cured layer 6.

Although the embodiment described above shows an example where photosensitive resin only the surface of which is photo-cured with radiation of light is provided on the substrate 1, the present invention includes a case where the insulating layer to be provided on the substrate 1 is a resin layer consisting of non-photosensitive resin coated with a thin layer of photosensitive resin. In this case, it is possible to coat photosensitive resin on the surface of non-photosensitive resin layer, and to remove at least the photosensitive resin layer in the removal step of the present invention so that the remaining non-photosensitive layer has the thickness of the final insulating layer.

Furthermore, dimerization resin may be suitably used as the photosensitive resin of the present invention. Similar effect can be attained by using another resin together with this resin and combining an etching mask.

As described, according to the present invention, a substantially bowl-shaped via hole on which a conductive layer is readily deposited and which can provide a conductive layer with a uniform thickness is readily formed by a process which only requires adjustment of thickness in, for example, grinding, the process comprising the steps of: (1) forming a resin layer on a substrate, the resin layer including photosensitive resin, the photosensitive resin being positioned on the top surface, and having a thickness greater than a first thickness; (2) forming cavities in a predetermined pattern by exposing and developing the resin layer; (3) heat-curing the resin layer formed with cavities; and (4) removing, e.g., grinding off, a part of the heat-cured resin layer to the first thickness, thereby forming via holes derived from the cavities.

We claim:

1. A manufacturing process for an organic chip carrier, comprising the steps of:

forming a resin layer on a substrate, said resin layer including photosensitive resin and being positioned on a top surface of said substrate, and said resin layer having a thickness greater than a first thickness;

forming cavities in a predetermined pattern on said resin layer by exposing and developing said resin layer;

heat-curing said resin layer formed with cavities; and reducing the thickness of said heat-cured resin layer to said first thickness, thereby forming via holes derived from said cavities.

2. A manufacturing process for an organic chip carrier according to claim 1, wherein said reducing step is carried out, at least in part, in a direction substantially normal to the thickness of said resin layer.

3. A manufacturing process for an organic chip carrier according to claim 1, wherein said via hole has a larger area at its opening than at the bottom of the via hole.

4. A method of forming an organic chip carrier comprising the steps of;

providing an insulating substrate;

forming electrical conducting terminal on said substrate;

forming a resin layer on said substrate and overlying said terminal, said resin layer including a photosensitive portion, said resin layer having a thickness greater than a first thickness;

forming at least one cavity in said resin layer by exposing and developing said resin layer, said at least one cavity overlying said electrically conducting terminal;

curing said resin layer;

reducing the thickness of said cured resin layer to said first thickness to form a via from said at least one cavity, said via extending through said entire first thickness of said resin layer; and plating electrically conducting material in said via and onto said contact.

5. The invention as defined in claim 4 wherein said cavity, when formed, has arcuate side walls.

6. The invention as defined in claim 4 wherein said step of reducing the thickness of said cured resin layer includes grinding of said resin layer.

7. The invention as defined in claim 4, wherein said resin layer is a single photoimageable material.

8. The invention as defined in claim 4, wherein said via has a larger area at its opening than at its intersection with said conductive terminal.

9. The invention as defined in claim 4, wherein circuitization is formed on top of said resin layer after reduction in thickness which circuitization is in electrical contact with said conducting material in said via.

* * * * *